United States Patent [19]
Van Der Plas

[11] Patent Number: 4,972,163
[45] Date of Patent: Nov. 20, 1990

[54] REGENERATING DEVICE HAVING A PHASE-LOCKED LOOP WITH LOOP GAIN COMPENSATION AND OFFSET COMPENSATION

[75] Inventor: Jaap Van Der Plas, Katwijk, Netherlands

[73] Assignee: Stichting Voor de Technische Wetenschappen, Utrecht, Netherlands

[21] Appl. No.: 438,962

[22] Filed: Nov. 20, 1989

[30] Foreign Application Priority Data

Nov. 21, 1988 [NL] Netherlands .......................... 8802868

[51] Int. Cl.$^5$ ..................... H03L 7/087; H03L 7/093; H03D 1/22
[52] U.S. Cl. ..................................... 331/12; 329/360; 329/350; 331/14; 331/15; 331/17
[58] Field of Search ........................ 331/12, 14, 15, 17, 331/25; 329/302, 308, 325, 360, 350; 455/260; 375/81, 120

[56] References Cited

U.S. PATENT DOCUMENTS

| | | | |
|---|---|---|---|
| 3,716,802 | 2/1973 | Muratani et al. | 331/12 X |
| 4,473,801 | 9/1984 | Maurer et al. | 329/50 |
| 4,546,322 | 10/1985 | Crutcher | 329/308 |

FOREIGN PATENT DOCUMENTS 0184873 6/1986 European Pat. Off. .
0320748 6/1989 European Pat. Off. .
2800242 7/1978 Fed. Rep. of Germany .
52-60052 5/1977 Japan .
6814760 4/1970 Netherlands .

*Primary Examiner*—Siegfried H. Grimm
*Attorney, Agent, or Firm*—Young & Thompson

[57] ABSTRACT

A regenerating device for regenerating a signal from a composite input signal, provided with a phase-locked loop comprising a first phase comparison circuit 1, a first low-pass filter 2 connected to the output thereof and a controlled oscillator 3. The control input of said oscillator 3 is connected to the output of the low-pass filter 2 while its quadrature output 3a is connected to one input of the phase comparison circuit 1. The input of the phase comparison circuit 1 forms the input of the regenerating device and the in-phase output of the oscillator 3 the output. Furthermore a second phase comparison circuit 4 and a second low-pass filter 5 connected thereto are provided, which correspond to the first phase comparison circuit and the first low-pass filter respectively. The input of the phase-locked loop and the in-phase output 3b of the controlled oscillator 3 are connected to the inputs of the phase comparison circuit 4. An AGC amplifier 7 fed back to its control input via a feedback path is connected to the output of the second low-pass filter 5. The signal fed back is fed to the control input of a gain-controllable amplifier 6 which is included in the phase-locked loop and which corresponds to the AGC amplifier 7.

6 Claims, 3 Drawing Sheets

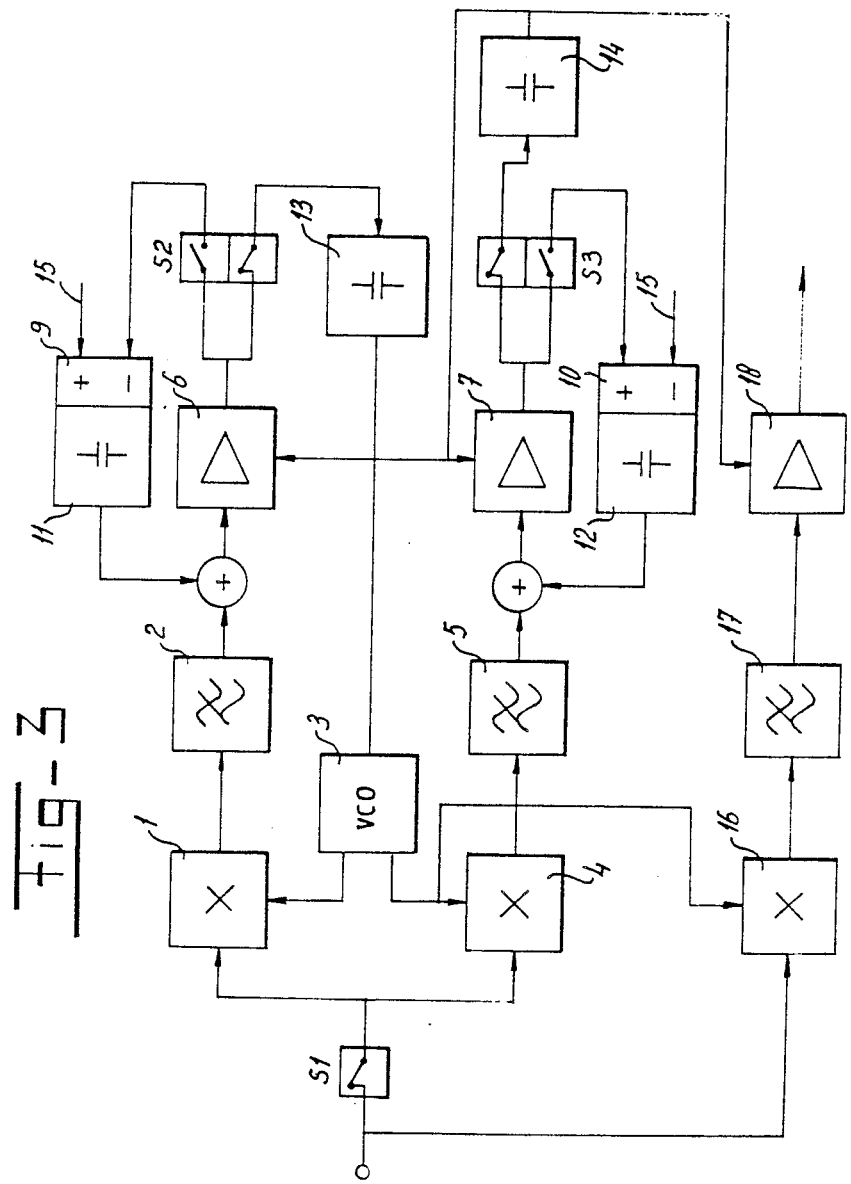

REGENERATING DEVICE HAVING A PHASE-LOCKED LOOP WITH LOOP GAIN COMPENSATION AND OFFSET COMPENSATION

The invention relates to a regenerating device for regenerating a signal from a composite input signal, provided with a phase-locked loop comprising a first phase comparison circuit, a first low-pass filter connected to the output thereof, and a controlled oscillator whose control input is connected to the output of the low-pass filter and whose quadrature output is connected to one input of the phase comparison circuit, the input of the phase comparison circuit forming the input of the regenerating device and the in-phase output of the oscillator the output, and provided furthermore with a second phase comparison circuit and a second low-pass filter connected thereto which correspond to the first phase comparison circuit and the first low-pass filter respectively, the input of the phase-locked loop and the in-phase output of the controlled oscillator being connected to the inputs of the phase comparison circuit.

A device of this type is known from the U.S. Pat. No. 4,473,801.

Furthermore, a phase-locked loop which is used in particular in a synchronous receiver is known from the Dutch Patent Application No. 8,403,648 and the corresponding European Patent Application 0,184,873.

In that case a mixer circuit is used as phase comparison circuit, which circuits are based on a linear multiplication by the oscillator signal of the composite signal received. This linear processing of the signal received is essential because intermodulation components produced by distortion disrupt the operation of the loop. For this reason it is not possible to set the signal levels with a limiting circuit.

The use of a phase-locked loop with a linear multiplier as phase comparison circuit for regenerating a signal from a composite signal varying in level presents the problem that the transmission of the phase comparison circuit and consequently the loop gain of the phase-locked loop are dependent on the level of the signal to which the loop is locked.

In the regenerating device known from the U.S. Pat. No. 4,473,801, one of the parameters of the phase-locked loop used therein which determine the loop gain thereof is controlled by means of a control signal which is obtained in a path which can be regarded as the quadrature path with respect to the phase-locked loop. In this case, one of the parameters of the phase-locked loop such as, for example, the voltage gain in the low-pass filter or the gain of the mixer device included in the loop can be controlled in inverse proportion to the received signal to be regenerated, with the result that the product of the parameters and the amplitude of the said received signal remain constant. This principle, also termed direct control, is not accurate.

The object of the invention is to provide a regenerating device of the type mentioned in the preamble in which the abovementioned problem is avoided.

According to the invention this object is achieved in that an AGC amplifier fed back to its control input via a feedback path is connected to the output of the second low-pass filter, the signal fed back being fed to the control input of a gain-controllable amplifier which is included in the phase-locked loop and which corresponds to the AGC amplifier.

This makes it possible to work with a composite signal which has a large dynamic range.

As a departure from the U.S. Pat. No. 4,473,801, in the in-phase path, i.e. in the path which includes the in-phase output of the controlled oscillator, the output signal of a gain-controllable amplifier is fed back to the input. In this manner, the output signal of said amplifier is kept constant. This control signal is also fed to a corresponding amplifier in the phase controlled loop so that the loop gain in said controlled loop is also kept constant. This control principle is also termed indirect feedback.

Because the two phase comparison circuits and low-pass filters correspond to each other, a greater accuracy can consequently be obtained than with the abovementioned direct control method without feedback described in the U.S. Pat. No. 4,473,801.

In order to improve the dynamic range still further, especially with small input signals, the offset error of the phase comparison circuit and the loop filter which produces a static phase error has to be compensated for. A solution for the problem mentioned is known from the abovementioned Dutch Patent Application.

The known offset error compensation system has the disadvantage that band-pass filters and a time-delaying network are used which are not simple to implement. In addition, strong side bands are produced which cause undesirable frequency components in the regenerated carrier wave signal. The principle of this known compensation method is based on an indirect frequency conversion, which is therefore inevitably accompanied by undesirable side bands.

The said disadvantages are avoided in that a periodical offset compensation phase is used in which a switch interrupts the supply of the composite input signal to the phase-locked loop, a memory circuit being present which holds the control signal of the controlled oscillator during said phase.

It is pointed out that an intermittent control is proposed in "Patents Abstracts of Japan", vol. 1, 126, 20 Oct. 1977, page 5497 E 77, JP-A-5260052, the European Patent Application 320,748 and the Dutch Patent Application 68.14760. The object of said controls and especially the actions which are undertaken during the two phases are, however, essentially different from that of the invention. The control in the Japanese Abstract has the object of setting the rest frequency of a controlled oscillator. The control in the European Patent Application 320,748 also has an object of this type, but in this case the said control is used directly in the phase-controlled loop.

The Dutch Patent Application 68.14760 only describes the use of a memory device for holding a phase error to stabilise the frequency of a controlled oscillator.

As a departure from the known controls, according to the invention a complete disconnecting of a composite input signal from the phase-locked loop including the in-phase path is brought about in order to compensate for the offset error in both the phase control loop and the in-phase path. The invention furthermore relates to a synchronous receiver in which a phase-locked loop according to the invention is used.

The invention will be explained in more detail below with reference to the drawings, in which:

FIG. 3 illustrates a block diagram of an embodiment, to be used by preference, of a synchronous receiver in which the phase-locked loop according to the invention is used.

Figure 1:
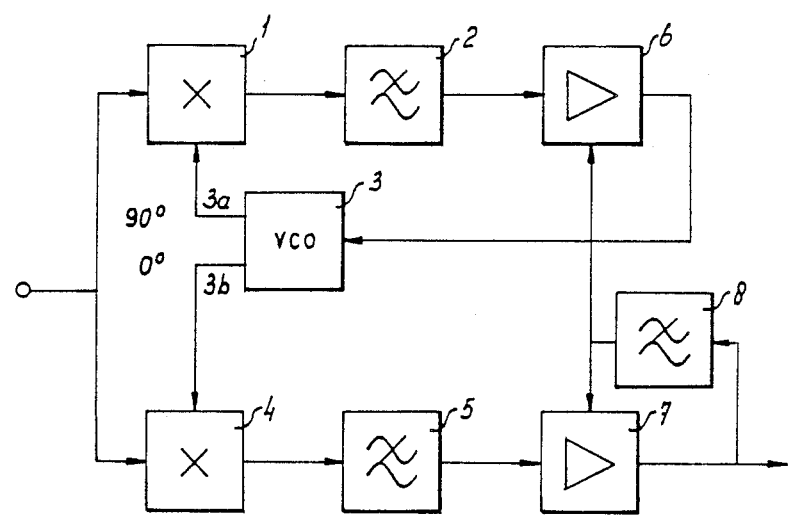
FIG. 1 shows a regenerating device containing a phase-locked loop with an automatically controlled loop gain according to the invention.

The phase-locked loop (PLL) according to the invention is particularly suitable for regenerating the carrier wave signal in a synchronous receiver and is therefore described below by way of example in connection with the said receiver. It is clear that the PLL can be used to regenerate a signal from any chosen composite input signal.

The carrier wave signal for the synchronous receiver is regenerated in this case from the received composite signal comprising a whole range of transmitter signals which differ considerably from one another in levels. In general, the phase-locked loop is formed by a phase comparison circuit or mixer circuit 1, a low-pass filter 2 and a controlled oscillator (VCO) 3 having a quadrature output 3a. If the PLL is used in a synchronous receiver, the carrier wave signal regenerated by means of the PLL is fed to the mixer circuit 16 of the synchronous detector to which a low-pass filter 17 and optionally an amplifier 18 are connected (see FIG. 3).

The channel selectivity of said receiver is determined by the properties of the low-pass filters.

Preferably, the PLL for regenerating the carrier wave must be able to cope with a large dynamic range with loop properties remaining constant. Disregarding the dynamic behaviour, the dynamic range is limited at the top by the driving limit and at the bottom by, inter alia, the zero-point error (offset) in the phase comparison circuit 1 and the loop filter 2. The magnitude of the composite input signal determines the loop gain of the PLL. In order to obtain a large dynamic range of the composite input signal, the loop gain of the PLL is kept constant. For this purpose, an indirect negative feedback path is used in which a control signal is generated, which signal controls the loop gain of the phase-locked loop. The indirect feedback path is formed by an in-phase path shown in FIG. 1. In said in-phase path, the in-phase output 3b of the VCO 3 is fed to a second phase comparison circuit 4 to the output of which a second low-pass filter 5 is connected. The DC signal on the output of the low-pass filter 5 is a measure of the amplitude of the signal to be regenerated, which DC signal can be used to control the gain-controllable loop amplifier 6. In this embodiment, the output of the low-pass filter 5 is connected to an AGC amplifier 7 fed back to the control input via a further low-pass filter 8, the signal fed back also being fed to the control input of the loop amplifier 6.

The solution described above can be used advantageously in a synchronous receiver. This is because a mixer circuit and a low-pass filter are already present in a detector of this type, with the result that only a so-called AGC amplifier whose control signal is also used for the controllable loop amplifier 6 needs to be connected to the output of the low-pass filter in the detector circuit.

In this circuit, the magnitude of the input signal determines both the loop gain of the PLL and the level of the detected signal. Consequently, a synchronous detector is achieved which has a large dynamic range with constant properties. A considerable gain is possible only after conversion and filtering, when adjacent transmitters have been sufficiently suppressed. For this reason, a low-pass filter 5 is used between the mixer circuit 4 and the AGC amplifier 7, 8. Without said low-pass filter, the AGC amplifier would be overdriven by a possible strong adjacent transmitter.

The loop gain of the PLL and the level of the detected signal can be kept constant due to the AGC amplifiers 6 and 7, 8 respectively. The control signal of the AGC amplifier 6 in the PLL is indirectly regenerated and consequently, the AGC amplifiers 6 and 7, 8 in the PLL and the detector circuit respectively must preferably be of corresponding construction, which means that the transmission characteristics are identical apart from a constant. Furthermore, the output impedance of the AGC amplifiers is preferably chosen high in connection with the embodiment of the loop filter. The DC output of the AGC amplifier 7 in the detection circuit is therefore kept constant by the AGC control circuit.

For an input signal Ui and a gain Aagc1 of the AGC amplifier 7, it therefore holds true that Ad.Ui.Aagc1=C, where Ad is the transmission characteristic of the phase comparison circuit 4 and the low-pass filter 5. The control signal is also fed to the control input of the AGC amplifier 6, whose gain Aagc2 is identical to that of the AGC amplifier 7 apart from a constant K.

Provided that the phase comparison circuit and the low-pass filters in the phase-locked loop and the in-phase path correspond to each other, it holds true that 4.Ad.Ui.Aagc2=K.Ad.Ui.Aagc1=KC. In this manner, the loop gain, which is proportional to Ad.Ui.Aagc2, is kept constant with great accuracy and input signals having a very large dynamic range can be fed to the regenerating device.

The AGC amplifier in the PLL compensates for the variation in the phase comparison circuit constant Kd, which is after all proportional to the level of the desired input signal.

The filter 5 serves to suppress the second and higher harmonics. If said filter is a low-frequency filter, the filter 8 is unnecessary since the function thereof is taken over by the filter 5.

Because the amplifiers, mixer circuits and the filters are connected to one another by means of a DC coupling, a zero-point error, often termed offset, will cause serious problems, especially in the case of a large dynamic range of the input signal, in particular in the case of input signals having a low reception level.

The abovementioned Dutch Patent Application 8,403,648 describes a solution for the offset problem in which an additional mixer circuit and a delay circuit are used to compensate for the delay time in the low-pass filter of the phase-locked loop. The greatest problem with this known principle is the occurrence of side bands, which are extremely undesirable because they cause incorrect lockings and impair the selectivity. In addition, said side bands cause objectionable whistling in the detected signal of the synchronous receiver.

Figure 2:
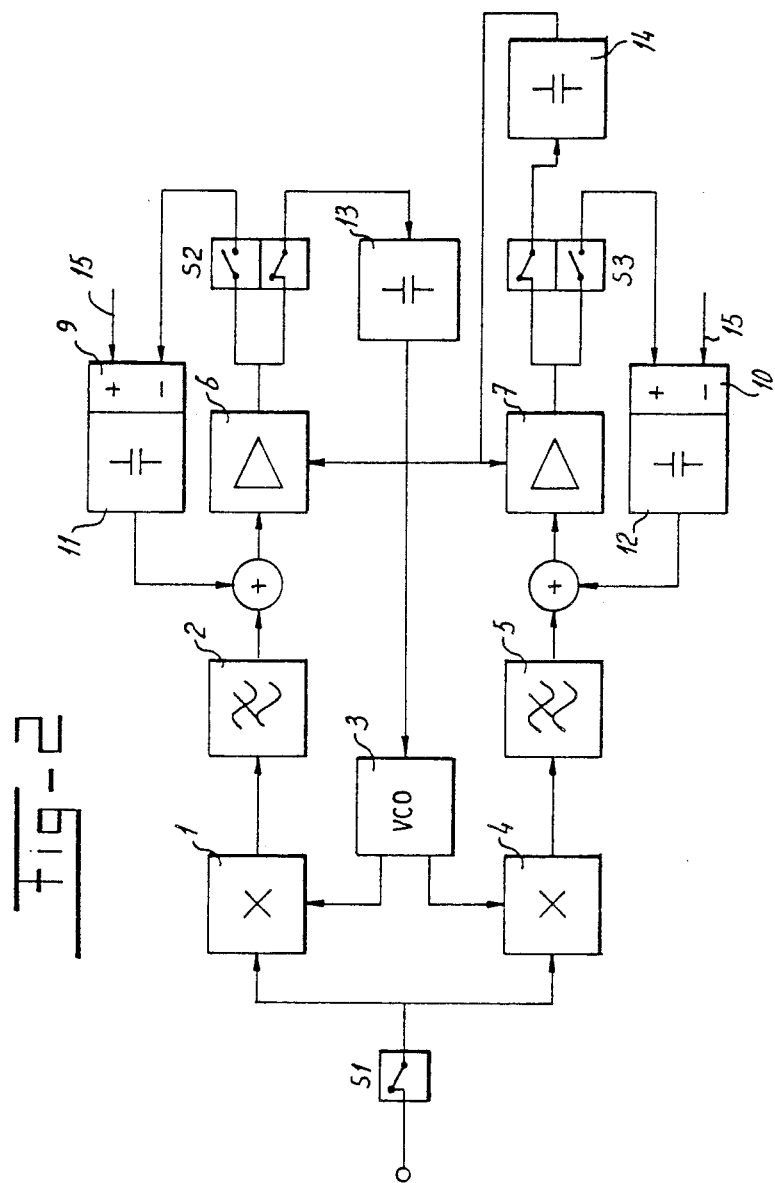
FIG. 2 shows a regenerating device containing a phase-locked loop with automatic loop gain and offset compensation according to the invention.

The principle of the offset compensation according to the invention is evident from FIG. 2, which shows an embodiment according to the invention. In this case, an additional mixer circuit and delay circuit can be dispensed with, it being possible to make do with simple low-pass filters.

The last mentioned principle is based on the periodical adjustment of the offset. During the offset compensation phase, the supply of the input signal is interrupted by means of the switch S1 and the output voltage of the loop amplifier 6 in the voltage comparison circuit 9 is compared with a reference voltage 15 by means of the switch S2 in order to generate an offset compensation voltage. Via the feedback, the output voltage will become virtually equal to the reference voltage, the input voltage of the VCO 3 being held by a memory circuit 13. If the gain of the AGC amplifier 6 is sufficiently high, the remaining offset produced by the voltage comparison circuit calculated back to the output of the phase comparison circuit is very small. During the working phase (autozero loop switched off), the offset adjustment is held by the memory circuit 11. The memory circuits 11 and 13 can be embodied by means of a capacitor with holding amplifier.

It is pointed out that use is made in this system of a voltage reference, the system known from the abovementioned Dutch Patent Application being based on a time reference.

The minimum autozero frequency is determined, inter alia, by the charge loss of the holding capacitor and the rate of drift of the offset. In principle an autozero frequency of a few hertz is adequate.

Because the autozero loop has a strong dominant pole, the loop gain can vary over a large dynamic range without risk of instability. This is because the loop gain depends on the gain of the AGC amplifier. If the variation of the loop gain of the autozero loop is nevertheless too high, a loop gain correction can be used in the comparison circuit or the holding amplifier. Said loop gain correction is essentially an inverted AGC control.

The offset voltage at the output of the mixer circuit 5 will seriously disturb the accuracy of the AGC control in the case of small input signals. Preferably, therefore, an offset compensation loop 10, 12 is used in which the voltage comparison circuit 10 and a memory circuit 12 correspond to the respective circuits of the loop amplifier 6. In order to achieve the switchover between offset compensation phase and working phase, a switch S3 and a memory circuit 14 are provided.

In the regenerating devices according to FIGS. 1 and 2, the signal to be regenerated can be taken off from the in-phase output 3b of the controlled oscillator. Said regenerating devices can also operate as synchronous receivers, the signal to be detected being available at the connection between the mixer circuit 4 and the filter 5.

FIG. 3 shows the final block diagram of an embodiment, to be used by preference, of a synchronous receiver in which as little inconvenience due to the periodical offset compensation is experienced. The components in FIG. 3 which correspond to those in FIGS. 1 and 2 are provided with the same reference numbers. A discussion of said components can therefore be omitted. Because the automatic offset compensation is unnecessary for the detected signal and is undesirable, especially in view of the disconnections, this signal is obtained via a third mixer circuit 16. For the detected signal, the mixer circuit 16 and the amplifier 18 can be connected to each other, if necessary via an AC current or AC voltage coupling in order to avoid seizure due to offset. A low-pass filter 17 is connected in the usual manner between the mixer circuit and amplifier 18.

The AGC signal generated for the loop amplifier 6 is also fed to the control input of the voltage-controllable amplifier 18 in the detection circuit of the synchronous receiver.

Furthermore, the switches of FIG. 3 take care of the switching between offset compensation phase and working phase of the synchronous detector.

I claim:
1. Regenerating device for regenerating a signal from a composite input signal, provided with a phase-locked loop comprising a first phase comparison circuit, a first low-pass filter connected to the output thereof, and a controlled oscillator whose control input is connected to the output of the low-pass filter and whose quadrature output is connected to one input of the phase comparison circuit, the input of the phase comparison circuit forming the input of the regenerating device and the in-phase output of the oscillator the output, and provided furthermore with a second phase comparison circuit and a second low-pass filter connected thereto which correspond to the first phase comparison circuit and the first low-pass filter respectively, the input of the phase-locked loop and the in-phase output of the controlled oscillator being connected to the inputs of the second phase comparison circuit, characterized in that an AGC amplifier fed back to its control input via a feedback path is connected to the output of the second low-pass filter, the signal fed back being fed to the control input of a gain-controllable amplifier which is included in the phase-locked loop and which corresponds to the AGC amplifier.

2. Regenerating device for regenerating a signal from a composite signal, provided with a phase-locked loop comprising a first phase comparison circuit, a first low-pass filter connected to the output thereof, and a controlled oscillator whose control input is connected to the output of the low-pass filter and whose quadrature output is connected to one input of the phase comparison circuit, the input of the phase comparison circuit forming the input of the regenerating device and the in-phase output of the oscillator the output, and provided furthermore with a second phase comparison circuit and a second low-pass filter connected thereto which correspond to the first phase comparison circuit and the first low-pass filter respectively, the input of the phase-locked loop and the in-phase output of the controlled oscillator being connected to the inputs of the second phase comparison circuit, characterized by a periodical offset compensation phase in which a switch interrupts the supply of the composite input signal to the phase-locked loop, a memory circuit being present which holds the control signal of the controlled oscillator during said phase.

3. Device according to claim 2, characterized in that during the offset compensation phase, a feedback path is connected across a loop amplifier included in the phase-locked loop, which path includes a voltage comparison circuit and a memory circuit connected thereto, a reference voltage and the output signal of the loop amplifier being fed to the respective inputs of the voltage comparison circuit.

4. Device according to claim 3, characterized in that, in the offset compensation phase, a second feedback path which corresponds to the feedback path associated with the loop amplifier is connected across a feedback amplifier included in the in-phase path.

5. Device according to claim 4, characterized in that a memory circuit is included in the second feedback path and said feedback path is interrupted during the offset compensation phase between the fedback amplifier and the low-pass filter.

6. Device according to claim 1 for use in a synchronous receiver, characterized in that a controllable amplifier is connected in an additional detection circuit, the control signal of the loop amplifier being fed to the control input thereof.

* * * * *